United States Patent [19]

Carnall, Jr. et al.

[11] Patent Number: 5,065,245

[45] Date of Patent: Nov. 12, 1991

[54] MODULAR IMAGE SENSOR ARRAY

[75] Inventors: Edward Carnall, Jr., Rochester; Robert L. Nielsen, Pittsford; Ozimek Edward J., Penfield, all of N.Y.

[73] Assignee: Eastman Kodak Company, Rochester, N.Y.

[21] Appl. No.: 516,991

[22] Filed: Apr. 30, 1990

[51] Int. Cl.$^5$ .................. H04N 5/335; H04N 3/14
[52] U.S. Cl. ................ 358/213.11; 358/209; 358/482; 250/208.1
[58] Field of Search .......... 358/213.11, 213.12, 358/213.13, 213.15, 213.17, 482, 494, 446, 209; 250/208.1

[56] References Cited

U.S. PATENT DOCUMENTS

| | | | |
|---|---|---|---|
| 4,438,457 | 3/1984 | Tandon et al. | 358/213 |
| 4,471,375 | 9/1984 | Oritsuki et al. | 357/68 |
| 4,644,411 | 2/1987 | Sato et al. | 358/294 |
| 4,691,114 | 9/1987 | Hasegawa et al. | 250/578 |
| 4,734,787 | 3/1988 | Hayashi | 358/484 |
| 4,760,440 | 6/1988 | Bigler et al. | 357/74 |
| 4,775,895 | 10/1988 | Traupe et al. | 358/294 |

Primary Examiner—Howard W. Britton
Assistant Examiner—Tuan V. Ho
Attorney, Agent, or Firm—Donald D. Schaper

[57] ABSTRACT

A modular image sensor array is disclosed which includes a plurality of tiles each of which has an image sensor mounted thereon. The tiles are mounted on a base plate such that the image sensors form a predetermined pattern. In order to precisely locate the tiles relative to each other and to provide for the replacement of defective tiles, the tiles are assembled in an interlocking pattern on the base plate. The top surface of the tiles is formed by ceramic plates, and electrical conductors for the image sensors are formed on one of the ceramic plates. A transparent cover is mounted over all of the image sensors in the array.

18 Claims, 2 Drawing Sheets

MODULAR IMAGE SENSOR ARRAY

BACKGROUND OF THE INVENTION

1. Field of the Invention

The present invention relates to a modular image sensor array, and more particularly, to such an array in which a plurality of image sensors are assembled in a predetermined pattern on a substrate.

2. Description of the Prior Art

Image scanners are known for reading optical information in the form of text or graphics and converting the optical information into an analog electrical signal. The analog signal is then converted into digital information for image processing and image reproduction. In one arrangement of such a scanner, an image is projected onto a single image sensor by means of demagnification optics. Disadvantages of this arrangement are the necessity for a relatively long light path and the necessity for extreme accuracy in positioning the image sensor. In another type of scanner, as shown, for example in U.S. Pat. No. 4,775,895, an array of image sensors are used in order to overcome the problems associated with the demagnification optics in a scanner using a single sensor.

U.S. Pat. No. 4,775,895, discloses a modular image sensor structure in which a plurality of drive modules are mounted on a substrate of ceramic or glass. Each of the drive modules contains a line of sensor elements. A disadvantage of the structure shown in the patent is that drive modules are spaced from each other on the substrate, and it is very difficult to precisely locate the drive modules relative to each other in order to form a desired pattern of sensor elements. A further disadvantage is that the glass or ceramic substrate is fragile and must be handled with care.

SUMMARY OF THE INVENTION

It is an object of the present invention to overcome the problems disclosed in the prior art discussed above and to provide an improved modular image sensor array.

In accordance with one aspect of the present invention, there is provided a modular image sensor array comprising: a plurality of tiles, each of the tiles including an image sensor on a surface thereof; and means for suppporting the tiles such that the image sensors form a predetermined pattern, each of the tiles being in abutment with an adjacent tile on the supporting means and each of the tiles being configured such that the tiles form an interlocking pattern on the supporting means.

In one embodiment of the present invention, a modular image sensor array comprises a stainless steel base plate and four tiles mounted on the base plate. Each of the tiles supports a linear CCD image sensor. The tiles are generally T-shaped, and they are mounted on the base plate such that the image sensors form a predetermined pattern in which the image sensors overlap. Each of the image sensor is mounted along a central portion of the tile. Ceramic plates are mounted on a surface of each tile, and the plates are arranged on opposite sides of the image sensor. Electrical conductors are formed on one of the ceramic plates. An elongated transparent cover is mounted over the image sensors and is supported on the ceramic plates.

A principal advantage of the present invention is that the image sensors in the array can be very accurately located relative to each other. Another advantage is that individual tiles can be replaced in the array without affecting the positions of the other tiles. A further advantage is that an image sensor can be fully tested after the sensor is mounted on a tile and before the tile is assembled in the array. Finally, the metal base plate provides a very flat and stable support for the image sensor array.

Other features and advantages will become apparent upon reference to the following description of the preferred embodiment when read in light of the attached drawings.

BRIEF DESCRIPTION OF THE PREFERRED EMBODIMENT

Figure 1:
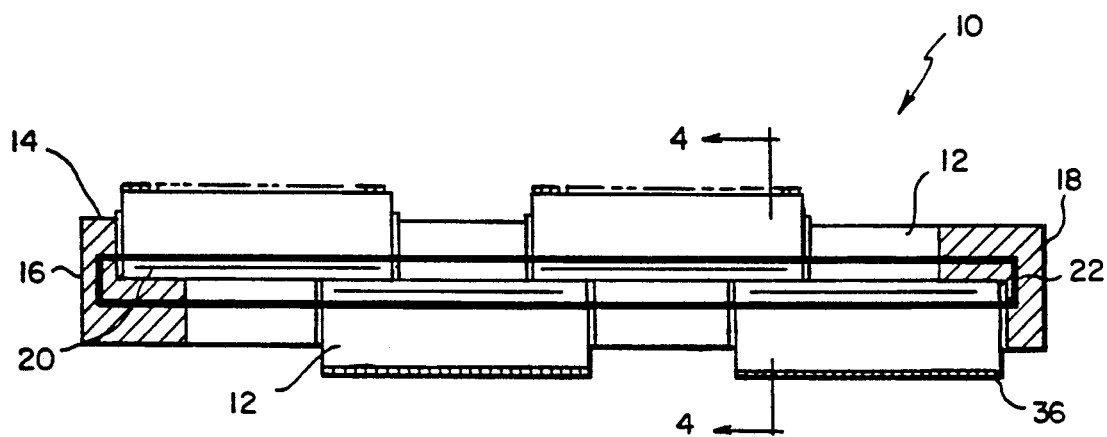
FIG. 1 is a plan view of the modular image sensor array of the present invention.

With reference to FIG. 1, there is shown a modular image sensor array 10 which is constructed in accordance with the present invention. Array 10 comprises four modules, or tiles, 12 which are mounted on a base plate 14. The number of tiles in array 10 will depend on the particular application and can be greater or less than four. Base plate 14 can be made from, for example, stainless steel. As shown in FIG. 1, tiles 12 are generally T-shaped, and the tiles 12 are mounted in an interlocking pattern on plate 14. Other shapes could be used for tiles 12, for example, L-shaped or triangular-shaped tiles.

The tiles 12 are located longitudinally on base plate 14 by means of L-shaped stops 16 and 18 disposed at opposite ends of plate 14. Each of the tiles 12 has an image sensor 20 mounted thereon, and the tiles are supported on base plate 14 such that the image sensors 20 overlap. It is known to overlap linear image sensors in this manner in order to insure that no information is lost in the area between adjacent sensors. Sensors 20 can also be supported in an abutting arrangement for certain applications. Each of the image sensors 20 can be, for example, a linear CCD image sensor. A transparent cover 22 is mounted over the sensor 20.

Each tile 12 includes a support 15 which is precisely machined from a plate of material, for example, stainless steel. One suitable machining technique is electrical discharge machining (EDM) which produces consistent results and can be used to machine a large number of tiles simultaneously. In one representative example, the tolerances on the supports 15 were held within 0.0001 inch (0.000254 cm), and the edge quality was acceptable for the vision system of an automated placement tool.

Image sensors 20 are precisely located on the supports 15 relative to the support edges. The image sensors 20 are bonded to the supports 15 by, for example, a temperature-cured, silver-filled epoxy which can be a 84-1LMI epoxy, sold by Ablestik Laboratories. The silver-filled epoxy provides electrical conductance as well as a physical bond.

Figure 3:
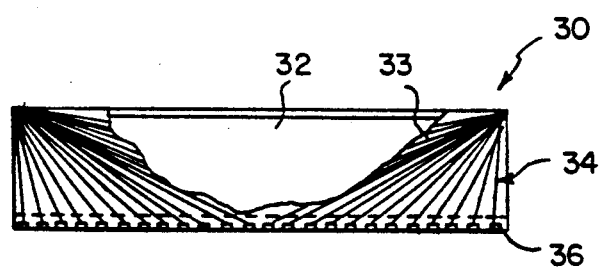
FIG. 3 is a plan view of one of the ceramic plates with part of a dielectric layer broken away in order to show the electrical conductors formed thereon.
Figure 4:
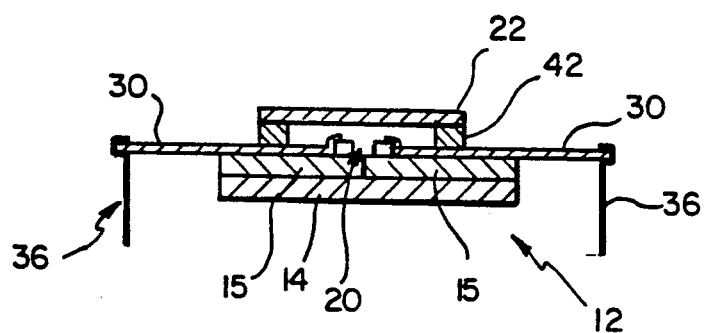
FIG. 4 is a sectional view taken along the line 4—4 in FIG. 1.
Figure 5:
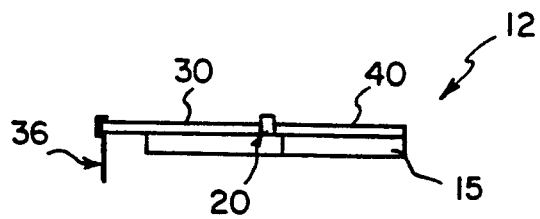
FIG. 5 is an end view of the tile shown in FIG. 2.

A ceramic plate 30 is mounted on each support 15 adjacent the sensor 20. The plate 30 can be an alumina ceramic, obtainable from the Coors Co. Each plate 30 is about 0.025 inches (0.0635 cm) thick. As shown in FIG. 3, a dielectric layer 32 and a conductor layer 34 are screen-printed on a top surface of plate 30; after each layer is formed, the layer is fired. Layer 34 is formed first on plate 30 and includes electrical conductors 33. As shown in FIG. 3, the electrical conductors 33 extend in a diverging pattern from the ends of the image sensor 20 to the edge connectors 36. The electrical conductors 33 in layer 34 can be made from a conductive paste, No. QS 170 or No. 9770, obtainable from the DuPont Co. Layer 32 is a dielectric layer which is formed over the layer 34 to insulate and protector the conductors 33 therein. A portion of layer 32 has been broken away in FIG. 3 in order to show the pattern of conductors 33. A dielectric paste, No. 5704, also obtainable from the DuPont Co., can be used for layer 32.

Figure 2:
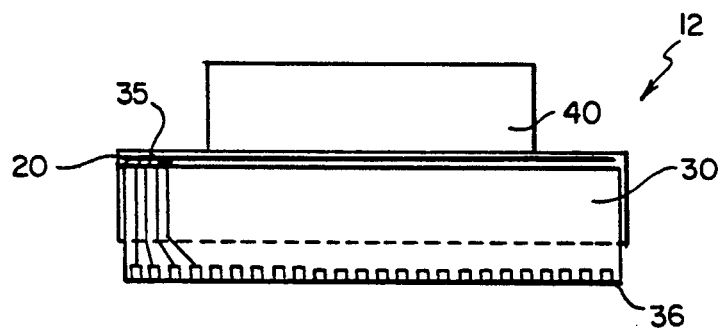
FIG. 2 is a plan view of an individual tile for the array.

The edge connectors 36 have a standard 0.1 inch (0.254 cm) pitch and are connected to the electrical conductors 33 on plate 30 prior to cementing the plate 30 to the support 15. The edge connectors 36 are connected to the electrical conductors 33 using, for example, a vapor phase solder reflow technique. Conventional ultrasonic wedge bonding is used for making the electrical bonds between wires 35 (FIG. 2) and the bond pads (not shown) on image sensor 20 and between wires 35 and the conductors 33. A silicon-doped aluminum wire having a diameter of 0.00125 inches (0.003175 cm) is used for the wires 35. After the connections between the image sensor 20 and the electrical conductors 33 have been made, the sensor 20 can be electrically tested. As noted above, there is a significant advantage in being able to fully test the sensor prior to assembling the tile 12 onto the base 14. An epoxy, for example, Ablebond epoxy 293-1, can be used to cement the plate 30 to support 15. Blank ceramic plates 40 are mounted on each support 15 opposite the plate 30. The ceramic plates 30 and 40 provide a uniform surface for the mounting of the transparent cover 22.

Although tiles 12 have been described herein as having a metal support 15 and ceramic plates 30 and 40 mounted thereon, it will be apparent to those skilled in the art that tile 12 could be made from a single piece of ceramic or other material. Further, plate 30 could be a metal plate with a ceramic coating, and plate 40 could be a metal plate or a metal plate having a ceramic coating.

Tiles 12 are assembled onto the base plate 14 using stop 16 as a first reference point. The tiles 12 form an interlocking pattern, as shown in FIG. 1, and the overlap of the image sensors 20 is controlled by the position of the image sensor 20 on the tile 12 and by the outside dimensions of the tiles. Stop 18 serves as a second reference point for the tiles 12 in array 10. The tiles 12 are secured to base plate 14 by means of a soluble adhesive or a mechanical means (not shown). The edge connectors 36 are positioned away from the base plate 14 to provide easy access for mounting and dismounting the array 10. As shown in FIG. 1, alternate tiles 12 are rotated 180° in plane with respect to the remainder of the tiles, and as a result, the edge connectors 36 from adjacent tiles 12 extend from opposite sides of the array 10.

Transparent cover 22 is mounted over the image sensors 20 to provide protection for the image sensors from dust and debris and to keep the delicate wire bonds from being damaged. Cover 22 can be made from glass, quartz, or other transparent material. The cover 22 is mounted on a supporting spacer 42. The spacer 42 is made from aluminum and has a black anodized surface which prevents the scattering of light and helps to electrically insulate the spacer 42. Spacer 42 is cemented to tiles 12 by a silicon resin, and the cover 22 is attached to the top of the spacer 42, using a u.v. curable resin.

The present invention can be used for both monochrome and color arrays. In one exemplary device, the array is approximately 10 inches (25.4 cm) long and is used to scan a page-sized document without the use of demagnification optics. Array 10 can be made without exposing the image sensor 20 to temperatures in excess of 100° C., and thus, the invention is particularly suitable for use in making color arrays which can be damaged by high process temperatures.

The invention has been described in detail with particular reference to a preferred embodiment thereof, but it will be understood that variations and modifications can be effected within the spirit and scope of the invention.

We claim:

1. A modular image sensor array comprising:
   a plurality of tiles, each of said tiles including an image sensor on a surface thereof and each of said tiles including a support and a dielectric surface on the support; and
   means for supporting the tiles such that said image sensors form a predetermined pattern, each of said tiles being in abutment with an adjacent tile on said supporting means and each of the tiles being configured such that the tiles form an interlocking pattern on the supporting means.

2. A modular image sensor array, as defined in claim 1, wherein said supporting means is a base plate.

3. A modular image sensor array, as defined in claim 2, wherein said base plate is a stainless steel base plate.

4. A modular image sensor array, as defined in claim 1, wherein a plurality of electrical conductors are formed on said dielectric surface.

5. A modular image sensor array, as defined in claim 4, wherein each of said electrical connectors is connected at one end to said image sensor and at an opposite end to an edge connector.

6. A modular image sensor array, as defined in claim 1, wherein said dielectric surface is on a ceramic plate mounted on the support.

7. A modular image sensor array, as defined in claim 6, wherein a second plate is mounted on each support, and said ceramic plate includes electrical conductors thereon which are connected to the image sensor on said tile.

8. A modular image sensor array, as defined in claim 7, wherein a transparent cover is mounted over said image sensors and is supported on said plates.

9. A modular image sensor array, as defined in claim 8, wherein a spacer is mounted between said plates and said tansparent cover.

10. A modular image sensor array, as defined in claim 1, wherein each of said tiles is generally T-shaped.

11. A modular image sensor array, as defined in claim 10, wherein alternate tiles are rotated 180° in plane relative to the other tiles in order to form said interlocking pattern.

12. A modular image sensor array, as defined in claim 1, wherein said image sensors are arranged in a generally linear pattern.

13. A modular image sensor array, as defined in claim 12, wherein some of said sensors overlap with other of the sensors.

14. A modular image sensor array, as defined in claim 1, wherein a transparent cover is mounted over said image sensors.

15. A modular image sensor array comprising:
- a plurality of tiles, each of said tiles including an image sensor on a surface thereof; and
- a base plate for supporting the tiles such that said image sensors form a predetermined pattern, each of said tiles being in abutment with an adjacent tile on said base plate and each of the tiles being configured such that the tiles form an interlocking pattern on the base plate.

16. A modular image sensor array, as defined in claim 15, wherein each of said tiles includes a ceramic surface having electrical conductors thereon which are joined to said image sensor.

17. A modular image sensor array, as defined in claim 16, wherein each of said tiles includes a support and a plate having said ceramic surface thereon.

18. A modular image sensor array, as defined in claim 15, wherein each of said tiles is generally T-shaped, and each of the tiles is rotated 180° in plane with respect to an adjacent tile.

* * * * *